United States Patent
Nishimura et al.

(10) Patent No.: US 6,673,671 B1
(45) Date of Patent: Jan. 6, 2004

(54) SEMICONDUCTOR DEVICE, AND METHOD OF MANUFACTURING THE SAME

(75) Inventors: Hiroaki Nishimura, Tokyo (JP); Tomoharu Mametani, Tokyo (JP); Yukihiro Nagai, Tokyo (JP); Akinori Kinugasa, Tokyo (JP); Takeshi Kishida, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 60 days.

(21) Appl. No.: 09/722,479

(22) Filed: Nov. 28, 2000

Related U.S. Application Data

(63) Continuation-in-part of application No. 09/191,120, filed on Nov. 13, 1998, now abandoned.

(30) Foreign Application Priority Data

Apr. 16, 1998 (JP) ............................................. 10-106023

(51) Int. Cl.[7] .......................................... H01L 21/8242
(52) U.S. Cl. ...................... 438/253; 438/254; 438/396
(58) Field of Search ................. 438/386, 387, 438/396, 397, 399, 253, 254

(56) References Cited

U.S. PATENT DOCUMENTS

| | | | |
|---|---|---|---|
| 5,028,990 A | | 7/1991 | Kotaki et al. |
| 5,392,189 A | * | 2/1995 | Fazan et al. .................. 257/306 |
| 5,686,337 A | * | 11/1997 | Koh et al. .................... 438/240 |
| 5,786,250 A | * | 7/1998 | Wu et al. ..................... 438/254 |
| 5,895,250 A | * | 4/1999 | Wu .............................. 438/253 |
| 6,051,859 A | | 4/2000 | Hosotani et al. |
| 6,066,528 A | * | 5/2000 | Fazan et al. ................. 438/240 |
| 6,083,831 A | * | 7/2000 | Dennison .................... 438/253 |

FOREIGN PATENT DOCUMENTS

| | | |
|---|---|---|
| DE | 4301690 A1 | 7/1993 |
| DE | 4307725 A1 | 9/1993 |
| DE | 4404129 A1 | 8/1994 |
| DE | 19527023 C1 | 7/1995 |
| JP | 3-174765 | 7/1991 |
| JP | 7-335842 | 12/1995 |

* cited by examiner

*Primary Examiner*—Michael Trinh
(74) *Attorney, Agent, or Firm*—McDermott, Will & Emery

(57) ABSTRACT

There is described a semiconductor device having a storage node capacitor structure suitable for rendering memory cells compact, and storage nodes are prevented from tilting. The device includes a storage node which has a vertical surface extending in the direction perpendicular to the surface of a semiconductor substrate, and a dielectric film for tilt prevention purposes which is brought into close contact with the side surface of the vertical surface and which prevents the vertical surface from tilting.

3 Claims, 12 Drawing Sheets

SEMICONDUCTOR DEVICE, AND METHOD OF MANUFACTURING THE SAME

RELATED APPLICATIONS

This application claims priority from and is a continuation-in-part application of U.S. patent application Ser. No. 09/191,120 filed Nov. 13, 1998, abandoned, which is incorporated herein by reference.

BACKGROUND OF THE INVENTION

1. Field of the Invention

The present invention generally related to a semiconductor device and to a method of manufacturing the same, and more particularly, to a semiconductor device having a storage node capacitor structure suitable for rendering compact a storage node which is a constituent element of a memory cell, as well as to a method of manufacturing the semiconductor device.

2. Description of the Background Art

A capacitor having a storage node as its constituent element is used for an existing memory IC, e.g., DRAM. Such a capacitor (hereinafter referred to as a "storage node capacitor") comprises a storage node formed from a base material such as polysilicon, a cell plate, and a dielectric film interposed between the storage node and the cell plate for ensuring electrical insulation therebetween. With the foregoing configuration, electric charges can be stored in the space between the storage node and the cell plate by application of a voltage.

In rendering the storage node capacitor compact, an effective measure is to ensure that the surface area of the storage node is large in relation to the occupation area of the storage node capacitor. For example, a larger surface area of the storage node can be ensured by forming the storage node into a cylindrical shape. For this reason, a structure which comprises a cylindrical storage node has already been known as the structure of the storage node capacitor.

To obtain a compact storage node capacitor having large capacitance through use of the existing structure, the storage node must be formed into a long and narrow cylindrical shape. However, the longer and narrower the cylindrical storage node, the easier the storage node tilts. For this reason, it is difficult to manufacture a compact storage node capacitor having large capacitance at a high-yield by using the existing structure.

SUMMARY OF THE INVENTION

It is a general object of the present invention to provide a novel and useful semiconductor device and a manufacturing method thereof.

A more specific object of the present invention is to provide a semiconductor device which has a storage node capacitor structure for effectively preventing a storage node from being tilted.

The above object of the present invention is achieved by a semiconductor device having a storage node capacitor structure. The semiconductor device comprises a storage node which has a vertical surface extending in the direction perpendicular to the surface of a semiconductor substrate; and a dielectric film for tilt prevention purposes which is brought into close contact with the side surface of the vertical surface and which prevents the vertical surface from tilting.

Other object of the present invention is to provide a method of manufacturing a semiconductor device having a storage node capacitor structure which effectively prevents a storage node from being tilted.

The above object of the present invention is achieved by a method of manufacturing a semiconductor device having a storage node and a dielectric film for tilt prevention purposes, wherein the storage node has a vertical surface which extends in the direction perpendicular to the surface of a semiconductor substrate, and wherein the dielectric film is brought into close contact with the side surface of the vertical surface and prevents the vertical surface from tilting. The method comprises the steps of forming in the surface of the semiconductor substrate a cylindrical space for use in forming the vertical surface through use of a dielectric film; forming in the cylindrical space the storage node having the vertical surface; and forming a dielectric film for preventing purpose which prevents the vertical surface from tilting by utilization of the dielectric film after formation of the vertical surface.

The above object of the present invention is also achieved by a method of manufacturing a semiconductor device including a storage node and a dielectric film for tilt prevention purposes, wherein the storage node has a vertical surface extends in the direction perpendicular to the surface of a semiconductor substrate and a horizontal surface extending along the surface of the semiconductor substrate, and wherein the dielectric film is brought into close contact with the side surface of the vertical surface and prevents the vertical surface from tilting. The method comprises the steps of forming the horizontal surface on the surface of the semiconductor substrate; forming a fourth dielectric layer having a given thickness from a fourth dielectric material on the horizontal surface; forming the vertical surface while being brought into close contact with the horizontal surface and the outer circumferential surface of the fourth dielectric layer; forming a fifth dielectric layer around the vertical surface from a fifth dielectric material differing from the fourth dielectric material; and eliminating the fourth dielectric layer by means of etching through use of a measure suitable for eliminating the fourth dielectric material and for conserving the fifth dielectric material.

Other objects and further features of the present invention will be apparent from the following detailed description when read in conjunction with the accompanying drawings.

DESCRIPTION OF THE PREFERRED EMBODIMENTS

Figure 1:
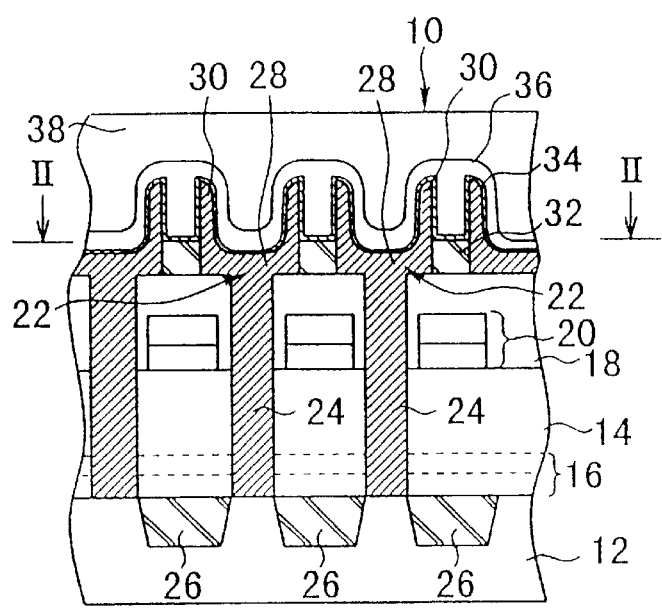
FIG. 1 is a cross-sectional view showing DRAM which has a storage node capacitor structure according to a first embodiment of the present invention.

In the following, principles and embodiments of the present invention will be described with reference to the accompanying drawings. Throughout the drawings, identical reference numerals are assigned to elements common to embodiments, and repetitions of their descriptions will be omitted here for brevity.

First Embodiment

FIG. 1 shows a fragmentary cross-sectional view of DRAM 10 having a storage node capacitor structure according to a first embodiment of the present invention.

The DRAM 10 comprises a silicon substrate 12. A first TEOS (Tetra Ethyl Ortho Silicate) layer 14 is formed on the silicon substrate 12. A plurality of transfer gates 16 which extend in parallel with one another are formed in the vicinity of the bottom surface of the first TEOS layer 14. A second TEOS layer 18 is formed on the first TEOS layer 14. In the vicinity of the bottom surface of the second TEOS layer 18, there is provided a plurality of bit lines 20 each of which extends in parallel with one another in the direction orthogonal to the transfer gates 16.

A plurality of storage nodes 22 are formed on the second TEOS layer 18. A storage node contact 24 connects with each of the storage nodes 22 and also contacts with the silicon substrate 12 passing through the first TEOS layer 14 and the second TEOS layer 18. A plurality of oxide layers 26 are provided in the silicon substrate 12 so as to prevent short circuits among the adjacent storage node contacts 24.

Each of the storage node 22 comprises a horizontal surface 28 extending along the surface of the second TEOS layer 18 and a vertical surface 30 extending at right angles to the surface of the second TEOS layer 18. The vertical surface 30 has a cylindrical shape which surrounds the horizontal surface 28. A dielectric film 32 for tilt prevention purposes is provided between the adjacent storage nodes 22 on the second TEOS layer 18. The storage node capacitor structure according to the present embodiment is characterized by comprising the aforementioned dielectric film 32 for tilt prevention purposes.

The storage nodes 22 and the dielectric film 32 is covered by a nitride film 34. A cell plate 36 is provided over the nitride film 34. An interconnection layer 38 is formed on the cell plate 36 which incorporates aluminum wiring patterns used for connecting the DRAM 10 to external circuits. Together with the nitride film 34 and the cell plate 36, each of the storage nodes 22 acts as capacitors for storing electric charges when a voltage is applied thereto.

Figure 2:
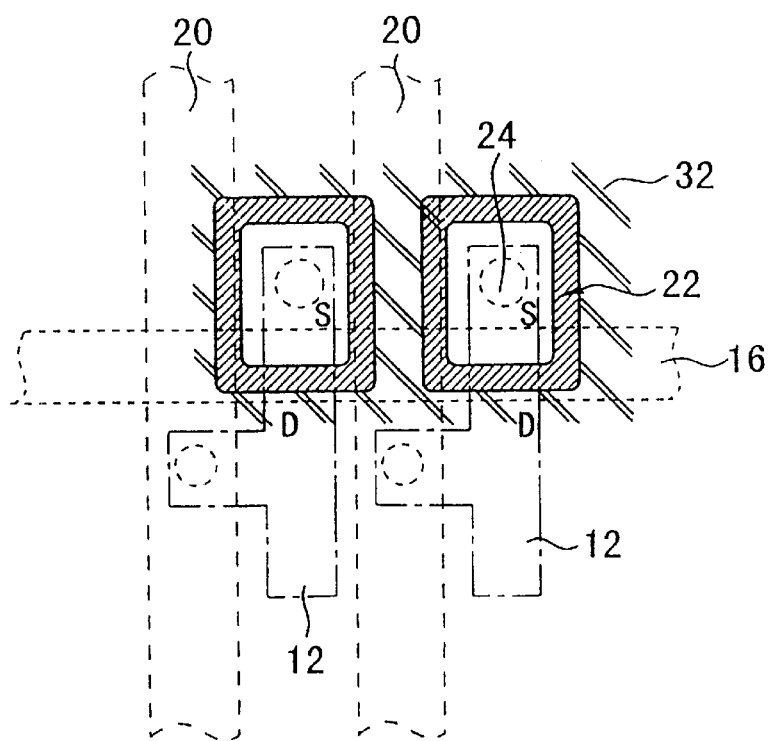
FIG. 2 is a cross-sectional view which is taken along line II—II provided in FIG. 1 and which shows the DRAM having the storage node capacitor structure according to the first embodiment.
Figure 10:
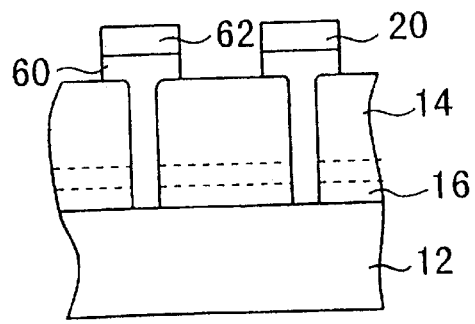
FIG. 10 is a fragmentary cross-sectional view of the semiconductor substrate shown in FIG. 9 when viewed in the direction designated by arrow X.

FIG. 2 is a cross-sectional view of the DRAM 10 taken along line II—II provided in FIG. 10.

As shown in FIG. 2, a source electrode S and a drain electrode D are provided at the both side of the transfer gate 16. The source electrode S is connected to the storage node contact 24, whereas the drain electrode D is connected to the bit line 20.

A channel—which is turned on or off according to the voltage applied to the transfer gate 16—is formed between the source electrode D and the drain electrode D. Data are written into the storage node 22 by applying a given voltage to the bit line 20 while the channel is in an ON state. In contrast, the data written into the storage node 22 are read by detecting a voltage of the bit line 20 while the channel is in an ON state.

A method of manufacturing the storage node capacitor shown in FIGS. 1 and 2 will now be described by reference to FIGS. 3 through 16.

FIGS. 3 through 7 are cross-sectional views for explaining forming process of oxide layers 26 on the silicon substrate 12.

Figure 3:
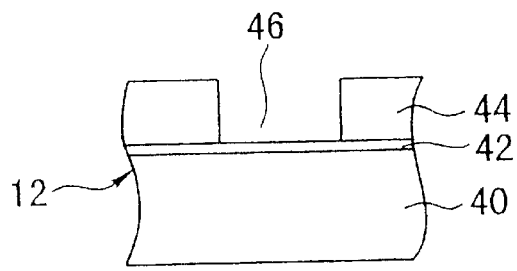
FIG. 3 is a fragmentary cross-sectional view for explaining the first through third steps of the method of manufacturing the DRAM shown in FIG. 1.

During the forming process of the oxide layers 26, at first, there are executed following proceeding operations (see FIG. 3).

(In the first step): processing for providing a sacrificial oxide film ($SiO_4$) 42 on the surface of a silicon substrate wafer 40;

(In the second step): processing for depositing a nitride film (SiN) 44 on the sacrificial oxide film 42; and (In the third step): processing for providing openings 46 in the nitride film 44 by means of photolithography and nitride-film etching.

Figure 4:
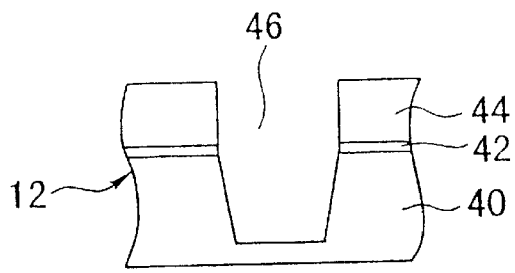
FIG. 4 is a fragmentary cross-sectional view for explaining the fourth and fifth steps of the method of manufacturing the DRAM shown in FIG. 1.

Next, there are performed following proceeding operations (see FIG. 4).

(In the fourth step): processing for eliminating the sacrificial oxide film 42 by means of oxide-film etching; and (In the fifth step): processing for expanding the openings 46 to a given shape by trench-etching the silicon wafer 40.

Figure 5:
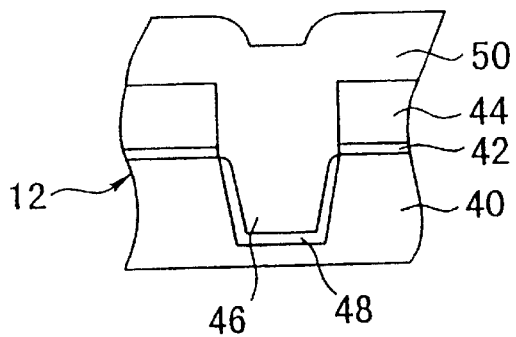
FIG. 5 is a fragmentary cross-sectional view for explaining the sixth and seventh steps of the method of manufacturing the DRAM shown in FIG. 1.

Third, there are performed following proceeding operations (see FIG. 5).

(In the sixth step): processing for providing oxide films 48 on the surface of the openings 46 formed in the silicon wafer 40; and (In the seventh step): processing for depositing TEOS 50 in the openings 46 and on the nitride film 44.

Figure 6:
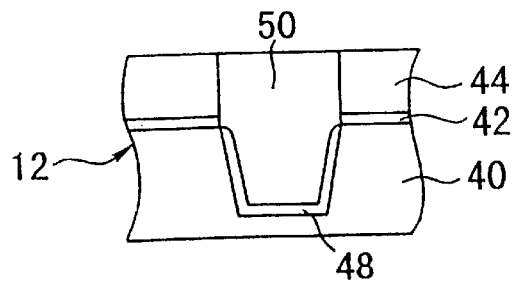
FIG. 6 is a fragmentary cross-sectional view for explaining the eighth step of the method of manufacturing the DRAM shown in FIG. 1.

Subsequent to completion of the foregoing process, there is performed following procedure operation (see FIG. 6).

(In the eighth step): processing for smoothing the silicon substrate 12 by etching back the TEOS 50 or by CMP (Chemical-and-Mechanical Polishing).

Figure 7:
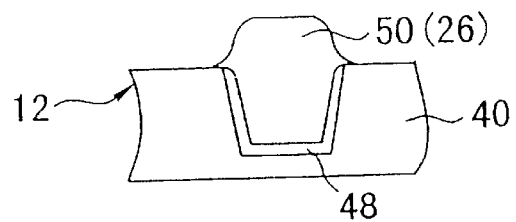
FIG. 7 is a fragmentary cross-sectional view for explaining the ninth and tenth steps of the method of manufacturing the DRAM shown in FIG. 1.

After smoothing of the silicon substrate 12, there are performed following proceeding operations (see FIG. 7).

(In the ninth step): processing for eliminating the nitride film 44 by nitride-film etching, and (In the tenth step): processing for eliminating the sacrificial oxide film 42 by means of oxide-film etching. In the first through tenth steps, oxide layers 26 can be provided on the silicon substrate 12.

Figure 8:
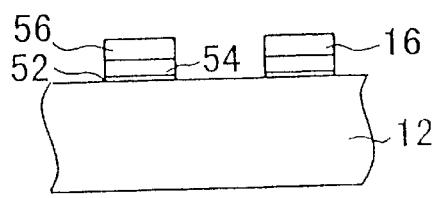
FIG. 8 is a fragmentary cross-sectional view for explaining the eleventh through fourteenth steps of the method of manufacturing the DRAM shown in FIG. 1.

After the formation of the oxide layers 26, there is performed processing for forming the plurality of transfer gates 16 on the silicon substrate 12 so that they extend in parallel with one another. FIG. 8 is a cross-sectional view for explaining the forming process of the transfer gates 16. During the forming process of the transfer gates 16, there are performed following proceeding operations (see FIG. 8).

(In the eleventh step): processing for forming gate oxide films 52 on the surface of the silicon substrate 12;

(In the twelfth step): processing for depositing doped polysilicon 54 on the surface of the gate oxide films 52;

(In the thirteenth step): processing for depositing tungsten silicide 56 over the doped polysilicon layers 54; and (In the fourteenth step): processing for forming the tungsten silicide layers 56 and the doped polysilicon layers 54 into given shapes by means of photolithography and etching.

After completion of the formation of the transfer gates 16, there is performed processing for forming the bit lines 20 orthogonal to the transfer gates 16.

Figure 9:
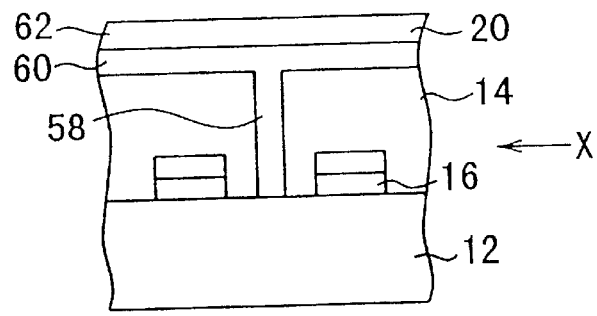
FIG. 9 is a fragmentary cross-sectional view for explaining the fifteenth through nineteenth steps of the method of manufacturing the DRAM shown in FIG. 1.

FIGS. 9 and 10 are cross-sectional views for explaining forming process of the bit lines 20. FIG. 10 is a cross-sectional view of the silicon substrate 12 as viewed in the direction designated by arrow X provided in FIG. 9. During the forming process of the bit lines 20, there are initially performed the following processing operations (see FIGS. 9 and 10).

(In the fifteenth step): processing for depositing TEOS on the transfer gates 16 so that the first TEOS layer 14 is provided; and (In the sixteenth step): processing for forming contact holes 58 in the first TEOS layer 14 by means of photolithography and oxide-film etching.

Subsequent to the formation of the contact holes 58 in the first TEOS layer 14, there are performed the following processing operations.

(In the seventeenth step): processing for depositing doped polysilicon 60 in the contact holes 58 and on the surface of the first TEOS layer 14;

(In the eighteenth step): processing for depositing tungsten silicide 62 on the doped polysilicon layers 60; and (In the nineteenth step): processing for forming the tungsten silicide layers 62 and the doped polysilicon layers 60 into a given shape by means of photolithography and etching.

After completion of the formation of the bit lines 20, there is performed processing for forming the storage node contacts 24.

Figure 11:
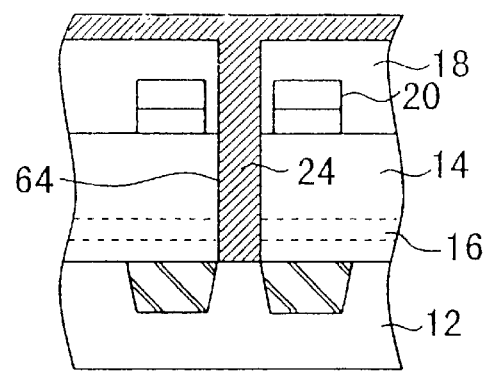
FIG. 11 is a fragmentary cross-sectional view for explaining the twenty-first through twenty-second steps of a method of manufacturing the DRAM shown in FIG. 1.
Figure 12:
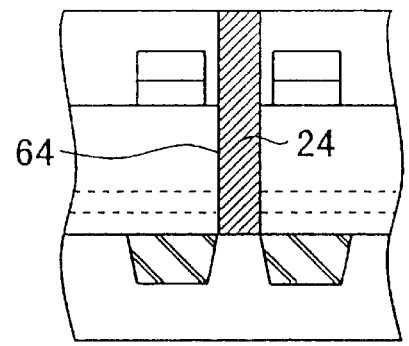
FIG. 12 is a fragmentary cross-sectional view for explaining the twenty-third step of the method of manufacturing the DRAM shown in FIG. 1.

FIGS. 11 and 12 are cross-sectional views for explaining forming process of the storage node contacts 24. During the process, at first, there are performed the following processing operations (see FIG. 11).

(In the twentieth step): processing for depositing TEOS on the bit lines 20 so that the second TEOS layer 18 is provided;

(In the twenty-first step): processing for providing the contact holes 64 in the first TEOS layer 14 and the second TEOS layer 18; and (In the twenty-second step): processing for depositing the doped polysilicon into the contact holes 64 and on the surface of the second TEOS layer 18.

As shown in FIG. 12, during the forming process of the storage node contacts 24, there is performed the following processing operation.

(In the twenty-third step): processing for eliminating doped polysilicon which is deposited on the surface of the second TEOS layer 18 by etching back. Through the foregoing processing, the storage node contacts 24 are formed in the contact holes 64.

After formation of the storage node contacts 24, there is performed processing for forming the storage nodes 22.

Figure 13:
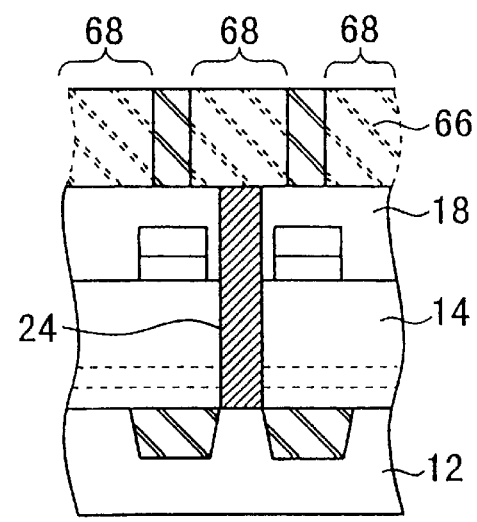
FIG. 13 is a fragmentary cross-sectional view for explaining the twenty-fourth and twenty-fifth steps of the method of manufacturing the DRAM shown in FIG. 1.
Figure 14:
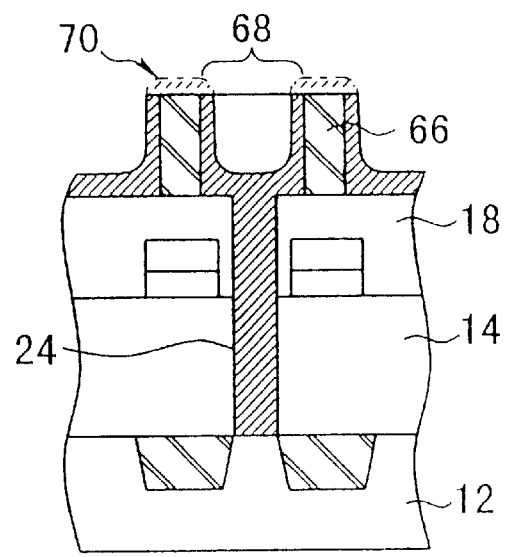
FIG. 14 is a fragmentary cross-sectional view for explaining the twenty-sixth and twenty-seventh steps of the method of manufacturing the DRAM shown in FIG. 1.

FIGS. 13 and 14 are cross-sectional views for explaining the forming step of the storage nodes 22. As shown in FIG. 13, during the forming process of the storage nodes 22, there are initially performed the following processing operations.

(In the twenty-fourth step): processing for depositing an oxide film 66 (designated by combination of a broken line and solid line provided in FIG. 13) over the second TEOS layer 18; and (In the twenty-fifth step): processing for forming a cylindrical space 68 by eliminating a portion of the oxide film 66 (designated by a broken line in FIG. 13)

through photolithography and oxide-film etching. In the twenty-fifth step, the cylindrical space 68 is provided at a position where the storage node 22 is to be formed.

As shown in FIG. 14, during the forming process of the storage nodes 22, there are performed the following processing operations following the foregoing operations.

(In the twenty-sixth step): processing for depositing doped polysilicon 70 (designated by combination of broken and solid lines provided in FIG. 14) into the cylindrical spaces 68 and on the remaining oxide film 66; and (In the twenty-seventh step): processing for eliminating the doped polysilicon 70 (designated by a broken line provided in FIG. 14) deposited on the oxide film 66 by CMP.

Through the foregoing processing, the storage nodes 22—each of which comprises the horizontal surface being in conduction with the storage node contact 24 and the cylindrical vertical surface 30 surrounding the horizontal surface 28—are provided in the cylindrical spaces 68. During the manufacturing process of the DRAM 10, subsequent to the formation of the storage nodes 22, there is performed processing for forming the dielectric film 32 which is the principal element according to the first embodiment.

Figure 15:
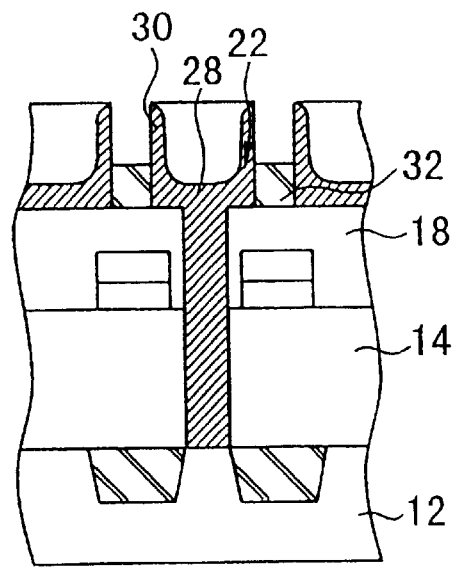
FIG. 15 is a fragmentary cross-sectional view for explaining the twenty-eighth step of the method of manufacturing the DRAM shown in FIG. 1.

FIG. 15 is a cross-sectional view for explaining a forming process of the dielectric film 32 for tilt prevention purposes. As shown in FIG. 15, during the forming process of the dielectric film 32, there is performed the following processing operation.

(In the twenty-eighth step): processing for causing the tip end of the storage node 22 to be out from the surface of the oxide film 66 (dielectric film 32) by reducing the thickness of the oxide film 66 between the adjacent storage nodes 22 to a given thickness by means of oxide-film etching. Through the foregoing processing, the dielectric film 32 which has a given thickness and is in close contact with the vertical surface 30 can be provided around the vertical surface 30 of each of the individual storage nodes 22.

In the first embodiment, the thickness of the dielectric film 32 is determined so that the tilting of the storage node 22 is effectively prevented and that the storage node 22 has a grate surface area. More specifically, in the first embodiment, the thickness of the dielectric film 32 is set to a given value which is greater than the thickness of the horizontal surface 28 of the storage node 22 and is smaller than the height of the vertical surface 30. Further, the thickness of the 144 dielectric film 32 is determined such that the storage node 22 assumes a desired capacity. The oxide-film etching for reducing the thickness of the dielectric film 22 may be a dry process or a wet process.

The foregoing manufacturing method can effectively prevent the storage nodes 22 from tilting prior to formation of the dielectric film 32 for tilt prevention purposes. Further, since the dielectric film 32 supports the storage nodes 22 after the formation thereof, subsequent steps are performed while the storage nodes 22 are prevented from tilting. For this reason, the storage node capacitor structure according to the first embodiment enables high-yield manufacture of the elongated storage nodes 22.

As mentioned previously, with regard to the storage node capacitor structure according to the first embodiment, the dielectric film 32 comprises an oxide film. The oxide film is suitable as an interlayer film of a semiconductor device. For this reason, the storage node capacitor structure according to the first embodiment enables to prevent the storage nodes 22 from tilting without any inconvenience.

After completion of the manufacturing of the dielectric film 32, there is executed a forming process of the nitride film 34.

Figure 16:
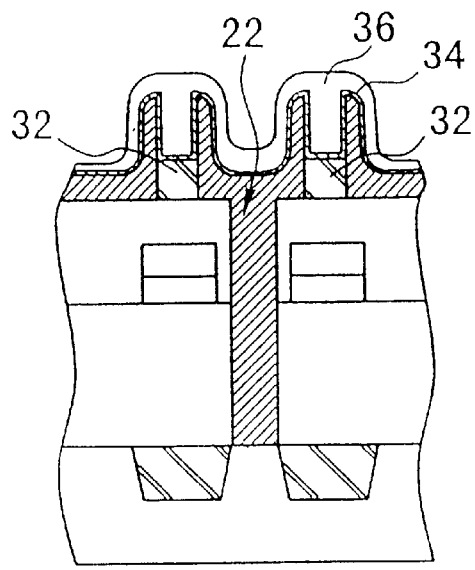
FIG. 16 is a fragmentary cross-sectional view for explaining the twenty-ninth and thirtieth steps of the method of manufacturing the DRAM shown in FIG. 1.

FIG. 16 is a cross-sectional view for explaining a forming process of the nitride film 34 and a forming process of the cell plate 36 which is implemented after the formation process of the nitride film 34. During the forming process of the nitride film 34, there is performed the following processing operation.

(In the twenty-ninth step): processing for depositing the nitride film 34 on the storage node 22 and on the dielectric film 32.

Next, during the forming process of the cell plate 36, there are performed the following processing operations.

(In the thirtieth step): processing for depositing doped polysilicon on the nitride film 34; and (In the thirty-first step): processing for forming the doped polysilicon into a desired shape by means of photolithography and etching.

As a result of the foregoing processing, the storage nodes 22, the nitride film 34, and the cell plate 36—all of which constitute capacitors—are formed. Subsequently, the interconnection layer 38 is provided on the cell plate 36 (in the thirty-second step) by known means, thereby completed the manufacturing process of the DRAM 10 according to the first embodiment.

Although in the foregoing embodiment the dielectric film 32 for tilt prevention purpose comprises an oxide film, the present invention is not limited to such an embodiment. The dielectric film 32 may comprises a nitride film. So long as the dielectric film 32 is formed from a nitride film, a superior tilt prevention function can be achieved, since the nitride film is harder than the oxide film.

In the first embodiment, the storage nodes 22 are formed so as to have a cylindrical shape and to be out from the surface of the dielectric film 32 at the tip end thereof in order to obtain a large capacitance at each of the storage nodes 22. The present invention is not limited to the foregoing embodiment. More specifically, in a case where there can be ensured the capacitance to be imparted to the storage node 22, the storage node 22 may be formed in to a columnar shape or other shapes. Further, in such a case, the dielectric film 32 for tilt prevention purposes may be brought into close contact with the entire outside surface of the storage nodes 22 by omitting the processing operation of the step 28.

In the first embodiment, the dielectric film 32 is formed to a thickness greater than that of the horizontal surface 28. However, the present invention is not limited to the foregoing embodiment. The thickness of the dielectric film 32 for tilt prevention purposes can be reduced to a greater extent within the range in which a desired tilt prevention function can be achieved.

Second Embodiment

Figure 17:
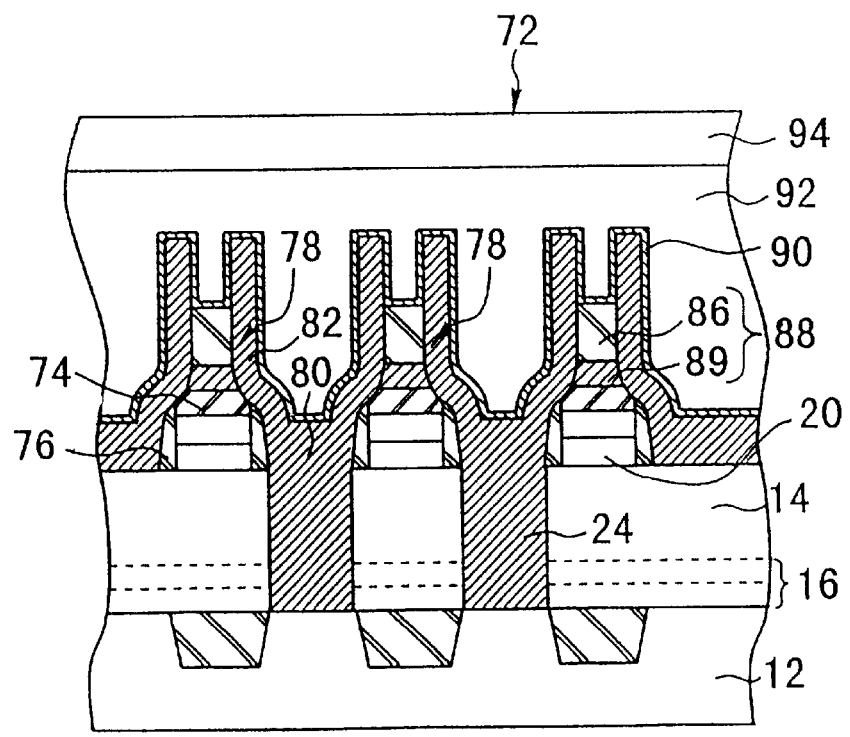
FIG. 17 is a cross-sectional view of the DRAM having the storage node capacitor structure according to the second embodiment.

A second embodiment of the present invention will now be described by reference to FIGS. 17 through 23. FIG. 17 is a cross-sectional view showing a DRAM 72 having a storage node capacitor structure according to the second embodiment.

The DRAM 72 comprises the plurality of bit lines 20 provided on the first TEOS layer 14. An upper and side walls 74 and 76 each of which comprises an oxide film are provided on the top and both sides of the bit line 20, respectively. A storage node 78 is formed between the bit lines 20 on the first TEOS layer 14. The bit lines 20 and the storage nodes 78 are insulated from one another by the upper and side walls 74 and 76.

The storage node 78 comprises a horizontal surface 80 extending along the surface of the first TEOS layer 14 and vertical surfaces 82 extending in the direction perpendicular to the first TEOS layer 14. The horizontal surface 80 is in contact with the storage node contact 24 penetrating through the first TEOS layer 14.

The foregoing structure is implemented by forming various layers on the first TEOS layer 14, by forming cylindrical spaces which penetrate through the layers and permit exposure of the surfaces of the storage node contacts 24, and by forming storage nodes 78 in the cylindrical spaces. In the second embodiment, as mentioned below, the cylindrical spaces are formed by a known self-alignment contact (SAC) method.

Among the storage nodes 78, there is formed a dielectric film 88 for tilt prevention purposes comprising a nitride film 84 and an oxide film 86. The dielectric film 88 has a thickness necessary for effectively preventing the storage nodes 78 from tilting and for imparting desired capacitance to the storage nodes 78, as in the case of the first embodiment. The storage nodes 78 and the dielectric film 88 for tilt prevention purposes are coated with a nitride film 90. A cell plate 92 and an interconnection layer 94 are formed on the nitride film 90.

A forming method of the storage node capacitor structure provided in FIG. 17 will now be described by reference to FIGS. 18 through 23.

With regard to the storage node capacitor structure according to the second embodiment, the silicon substrate 12, the first TEOS layer 14, the transfer gates 16, the bit lines 20, and the storage node contacts 24 are formed through the processing performed in the first through nineteenth steps (see FIGS. 3 through 10) and through the processing performed in the twenty-first through twenty-third steps (see FIGS. 11 and 12).

Figure 18:
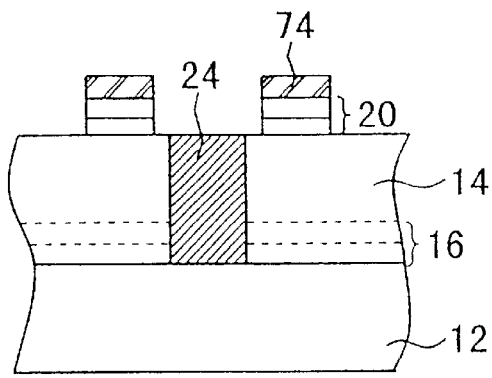
FIG. 18 is a fragmentary cross-sectional view for explaining the thirty-third step of the method of manufacturing the DRAM shown in FIG. 17.

FIG. 18 is a cross-sectional view for explaining an upper wall forming process to be performed subsequent to the process of forming the bit lines 20 and the storage node contacts 24. In the upper wall formation process, the upper wall 74 is formed by deposition of an oxide film on the bit line 20 (the thirty-third step).

After the formation of the upper wall, there is performed a side wall forming process.

Figure 19:
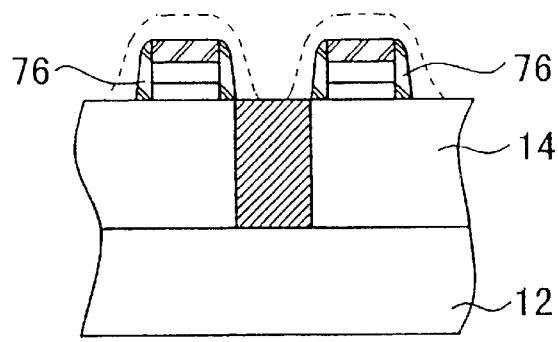
FIG. 19 is a fragmentary cross-sectional view for explaining the thirty-fourth and thirty-fifth steps of the method of manufacturing the DRAM shown in FIG. 17.

FIGS. 19 is a cross-sectional view for explaining the side wall forming process. During the side wall forming process, there are performed the following processing operations.

(In the thirty-fourth step): processing for depositing an oxide film in a manner as indicated by a broken line provided in FIG. 19, in order to cover the bit lines 20 and the upper walls 74; and (In the thirty-fifth step): processing for depositing doped polysilion 98 (indicated by a broken line and a solid line provided in FIG. 22) into the cylindrical spaces 96 on the remaining oxide film 86; and side walls 76 by etching back the oxide film.

After the formation of the side walls 76, there is performed a cylindrical space forming process.

Figure 20:
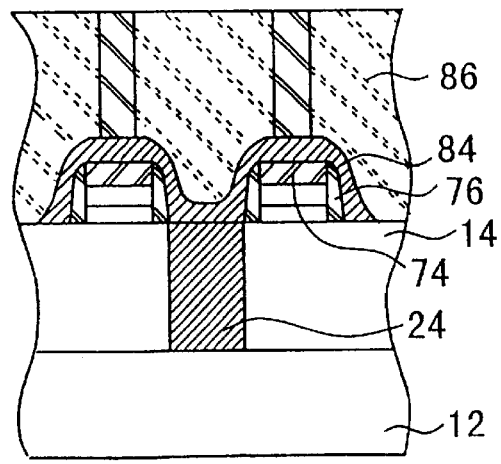
FIG. 20 is a fragmentary cross-sectional view for explaining the thirty-sixth through thirty-eighth steps of the method of manufacturing the DRAM shown in FIG. 17.
Figure 21:
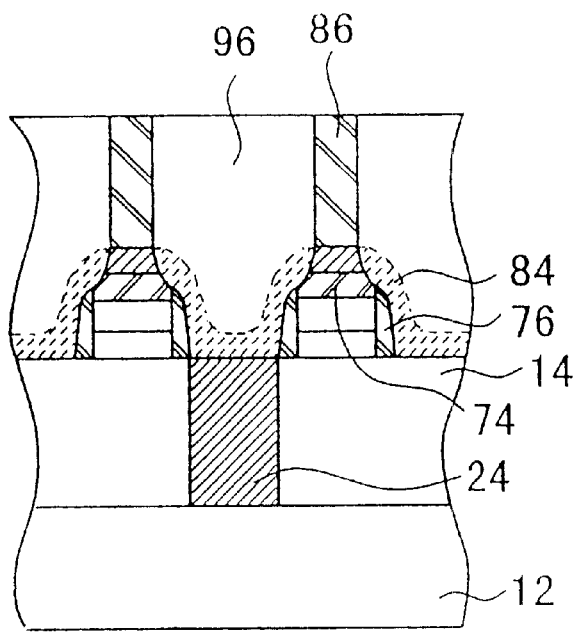
FIG. 21 is a fragmentary cross-sectional view for explaining the thirty-ninth step of the method of manufacturing the DRAM shown in FIG. 17.

FIGS. 20 and 21 are cross-sectional views for explaining the cylindrical space forming process. As shown in FIG. 20, during the cylindrical space forming process, there are initially performed the following processing operations.

(In the thirty-sixth step): processing for depositing the nitride film 84 so as to cover the bit lines 20 and the storage node contacts 24;

(In the thirty-seventh step): processing for depositing the oxide film 86 (indicated by combination of broken lines and solid lines provided in FIG. 20) on the nitride film 84; and (In the thirty-eighth step): processing for eliminating the area of the oxide film 86 indicated by the broken lines provided in FIG. 20 by means of photolithography and oxide-film etching. More specifically, there is performed processing for cylindrically eliminating the oxide film 86 from the area above the storage node contact 24.

In the thirty-eighth step, the oxide-film etching is performed in a condition which is suitable for removing the oxide film 86. In other words, the oxide-film etching is performed in a condition which is suitable for conserving the nitride film 84. Accordingly, through the processing performed in the thirty-eighth step, it is possible to remove only the oxide film 86 while the upper wall 74 and the side walls 76 covered with the nitride film 84 are protected.

As shown in FIG. 21, during the cylindrical space forming process, there is further performed the following processing operations.

(In the thirty-ninth step): processing for eliminating the area of the nitride film 84 indicated by a broken line provided in FIG. 21 by means of photolithography and nitride-film etching; namely, processing for cylindrically eliminating the nitride film 84 from the area above the storage node contact 24. In the thirty-ninth step, the subject area of the nitride-film etching operation is set so as to become larger than the storage node contact 24.

In the thirty-ninth step, the nitride-film etching is performed in a condition which is suitable for removing the nitride film 84 and for conserving the oxide film 86. Accordingly, the processing performed in the thirty-ninth step enables removal of only the nitride film 84 without regard to the upper wall 74 and the side walls 76 being included in the area to be etched.

So long as the area to be etched is set so as to become larger than the storage node contact 24 in the manner as mentioned previously, the nitride film 84 can be certainly removed from the upper surface of the storage node contacts 24 even when a photo mask used in photolithography process shifts from the right position. As mentioned above, the foregoing method enables the area—from which the nitride film 84 is removed—to be brought into agreement with the regions of the storage node contact 24 in a self-aligned manner. For this reason, the foregoing method according to the second embodiment enables formation of cylindrical spaces 96—which permit complete exposure of the surfaces of the storage node contacts 24—while there is ensured dielectric layers around the bit lines 20.

Subsequent to the formation of the cylindrical spaces 96, there is performed a storage node forming process.

Figure 22:
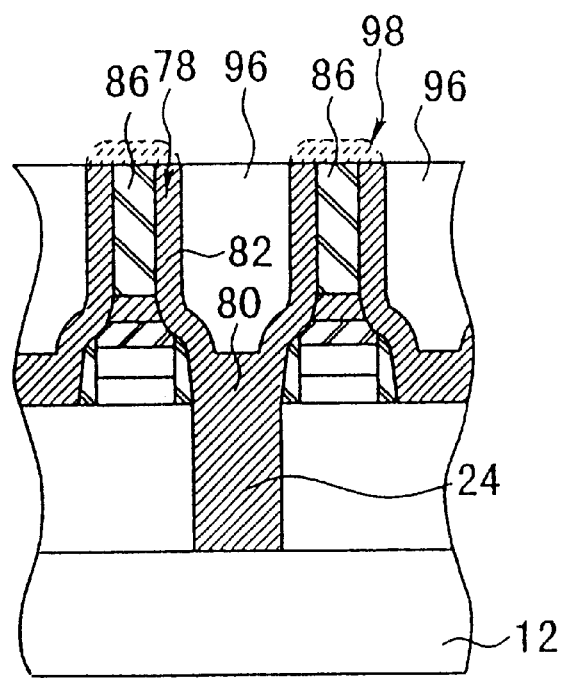
FIG. 22 is a fragmentary cross-sectional view for explaining the fortieth and forty-first steps of the method of manufacturing the DRAM shown in FIG. 17.

FIG. 22 is a cross-sectional view for explaining the storage node forming process. During the storage node forming process, there are performed the following processing operations.

(In the fortieth step): processing for depositing doped polysilicon 98 (indicated by a broken line and a solid line provided in FIG. 22) into the cylindrical spaces 96 and on the remaining oxide film; and (In the forty-first step): processing for eliminating the doped polysilicon 98 (indicated by the broken line provided in FIG. 22) deposited on the oxide film 86 by means of CMP.

Through the foregoing processing, within the cylindrical spaces 90 there are formed storage nodes 78 each comprising the horizontal surface 80 in connection with the storage node contact 24 and the cylindrical vertical surface 82 surrounding the horizontal surface 80. Subsequent to the storage nodes forming process, during the manufacturing process of the DRAM 72, there is performed processing for forming a dielectric film 88 for tilt prevention purposes.

Figure 23:
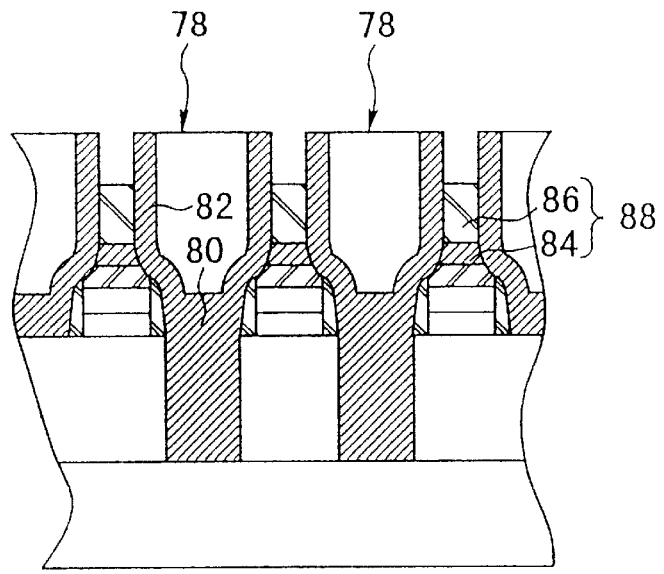
FIG. 23 is a fragmentary cross-sectional view for explaining the forty-second step of the method of manufacturing the DRAM shown in FIG. 17.

FIG. 23 is a cross-sectional view for explaining a process for forming the dielectric film 88 for tilt prevention purposes. As shown in FIG. 23, during the dielectric film forming process, there is performed the following processing operation.

(In the forty-second step): processing for causing the tip end of the storage node 78 to be out from the surface of the oxide film 86 by reducing the thickness of the oxide film 86 interposed among the adjacent storage nodes 78 to a given thickness by means of oxide-film etching. By means of the foregoing processing, the dielectric film 88 for tilt prevention purposes—which has a given thickness and is in close contact with the vertical surface 82 of the storage node 78—can be formed around the vertical surface 82. In this embodiment, the thickness of dielectric film 88 is determined such that the storage node 78 assumes a desired capacity. The oxide-film etching for reducing the thickness of the oxide film 86 may be a dry process or a wet process.

After the formation of the dielectric film 88, the following processing is performed as in the case of the first embodiment. Namely, a nitride film 90 is formed on the storage nodes 78 and the dielectric film 88 (the forty-third step); a cell plate 92 is formed on the nitride film 90 (the forty-fourth step); and an interconnection layer 94 is provided on the cell plate 92 (the forty-fifth step). The DRAM 72 according to the second embodiment is manufactured through the forgoing process.

The foregoing manufacturing method enables formation of the dielectric film 88 comprising a mixed film of the oxide film 86 and the nitride film 84 among the adjacent storage nodes 78. Therefore, the storage node capacitor structure according to the second embodiment enables high-yield manufacture of the elongated storage nodes 78 by means of the SAC method.

As mentioned previously, the oxide film constituting apart of the dielectric film 88 in the storage node capacitor structure according to the second embodiment is suitable as an interlayer film of a semiconductor device. Further, the nitride film constituting the remaining part of the dielectric film 88 is suitable for obtaining a superior tilt prevention function because it is harder than an oxide film. For these reasons, the storage node capacitor structure according to the second embodiment enables to impart a semiconductor device both merits of the oxide and nitride films.

In the second embodiment, the upper and the side walls 74 and 76 comprise an oxide film. Further, the nitride film 84 and the oxide film 88 are deposited in that order on these walls. The present invention is not limited to such a structure. The oxide film and the nitride film may be used in the opposite part each other.

Third Embodiment

A third embodiment of the present invention will now be described by reference to FIG. 24.

Figure 24:
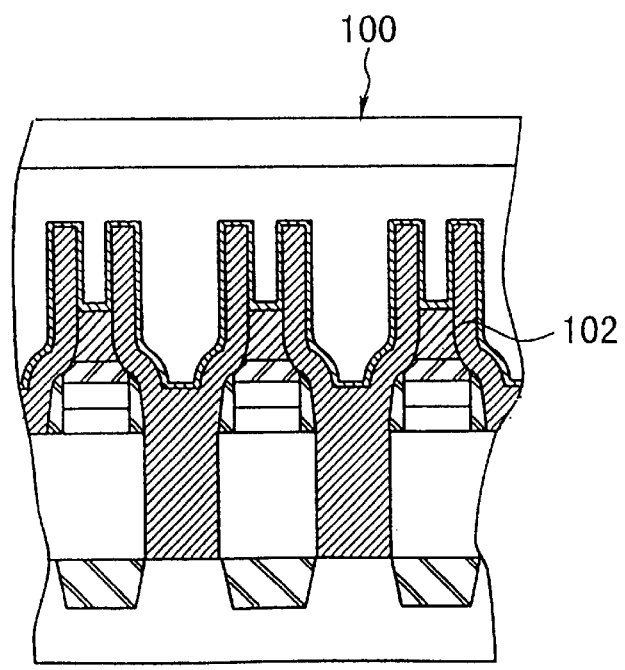
FIG. 24 is a fragmentary cross-sectional view showing DRAM having a storage node capacitor structure according to a third embodiment of the present invention.

FIG. 24 is a cross-sectional view showing a DRAM 100 having a storage node capacitor structure according to the third embodiment. The storage node capacitor structure according to the third embodiment is characterized by comprising a dielectric film for tilt preventing purpose which is formed solely from a nitride film, in place of the dielectric film in the second embodiment which comprises a mixed film of the nitride film 84 and the oxide film 88.

During the manufacturing process of the storage node capacitor structure according to the third embodiment, the nitride film 84 (see FIG. 20) is deposited so as to have a given thickness required to the dielectric film 102 for tilt preventing purpose in the foregoing thirty-seventh step, further, the oxide film 86 (see FIG. 23) deposited on the nitride film 84 is completely eliminated in the foregoing forty-second step.

In the foregoing structure, the thickness of the dielectric film 102 for tilt prevention purposes is determined solely by the thickness of the nitride film 84. For this reason, in the structure according to the third embodiment, control of the thickness of the dielectric film 102 is easy. Further, since the dielectric film 102 is formed solely from a nitride film, i.e., from a hard film, the structure according to the third embodiment provides a superior tilt prevention function.

Fourth Embodiment

A fourth embodiment of the present invention will now be described by reference to FIGS. 25 through 29.

Figure 25:
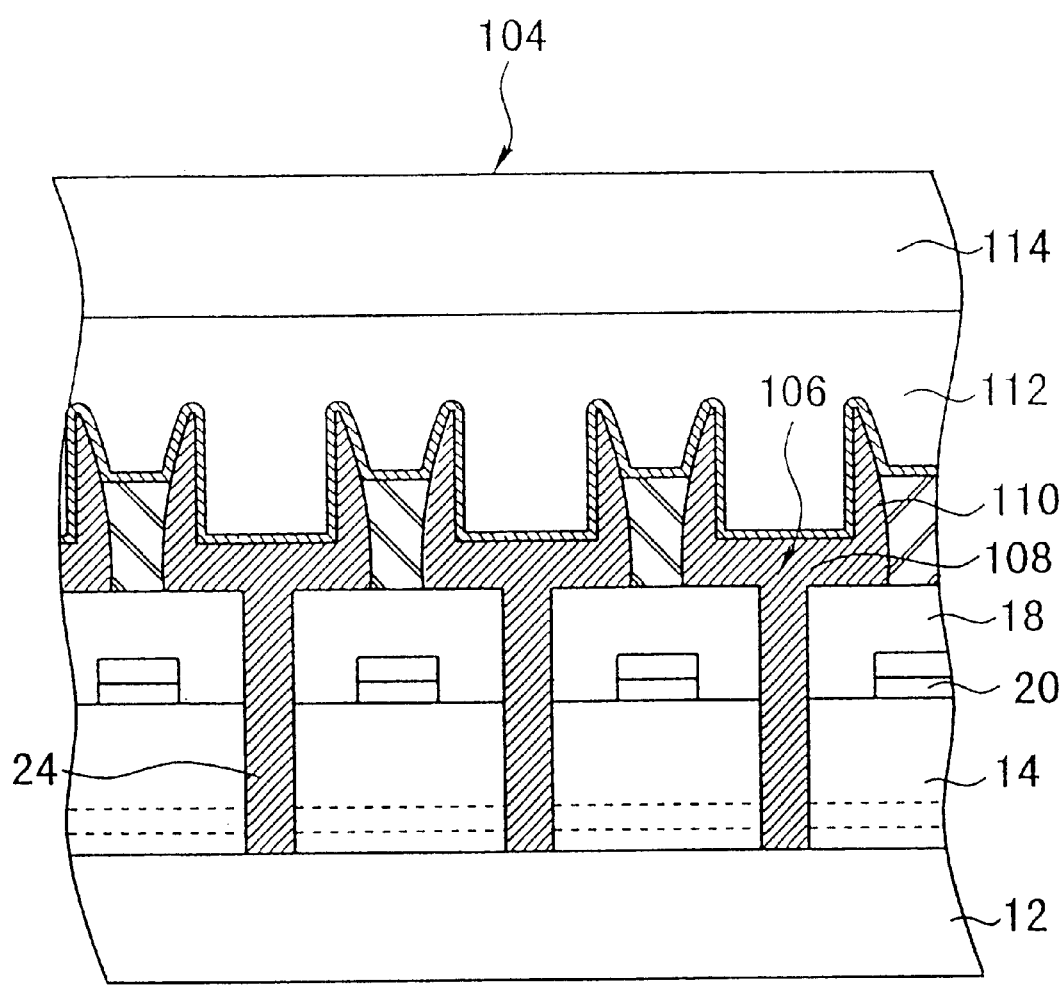
FIG. 25 is a fragmentary cross-sectional view showing DRAM having a storage node capacitor structure according to a fourth embodiment of the present invention.

FIG. 25 is a cross-sectional view showing a DRAM 104 having a storage node capacitor structure according to the fourth embodiment.

As shown in FIG. 25, the DRAM 104 comprises storage nodes 106. Each of the storage nodes 106 comprises a horizontal surface 108 and a vertical surface 110. A cell plate 112 and an interconnection layer 114 are formed on the storage nodes 106.

The DRAM 104 shown in FIG. 25 is substantially the same in structure as the DRAM 10 provided in FIG. 1. As mentioned above, during the step of manufacturing the DRAM 10 shown in FIG. 1, there is performed processing for forming cylindrical spaces through use of an oxide film prior to formation of the storage nodes 22. In contrast, the fourth embodiment is characterized in that the storage nodes 106 is formed without use of cylindrical spaces and in that an oxide film surrounding each of the storage nodes 106 is formed subsequent to the formation of the storage nodes 106.

A method of manufacturing the storage node capacitor structure as shown in FIG. 25 will be described by reference to FIGS. 26 through 29.

With regard to the storage node capacitor structure according to the fourth embodiment, the silicon substrate 12, the first TEOS layer 14, the transfer gates 16, the bit lines 20, and the contact holes 64 are formed through the processing performed in the foregoing first through twentieth steps (see FIGS. 3 through 11).

Figure 26:
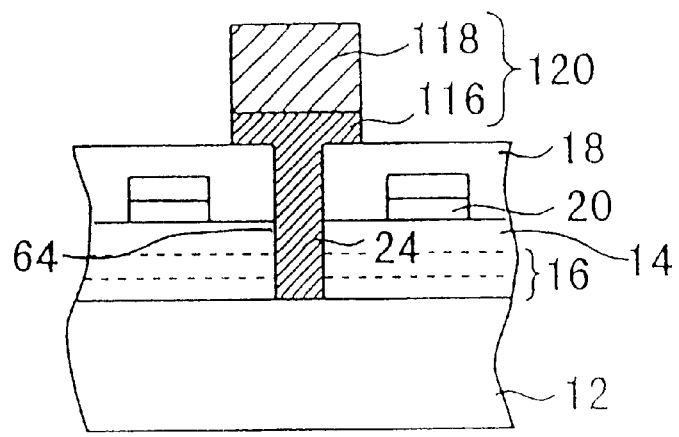
FIG. 26 is a fragmentary cross-sectional view for explaining the forty-sixth through forty-eighth steps of the method of manufacturing the DRAM shown in FIG. 25.

FIG. 26 is a cross-sectional view for explaining a process for forming a storage node base to be performed subsequent to the formation of the contact holes 64. During the process for forming the storage node table, there are performed the following processing operations.

(In the forty-sixth step): processing for depositing polysilicon 116 for use as a pad into the contact holes 64 and on the second TEOS layer 18;

(In the forty-seventh step): processing for forming the storage node base 120 by depositing a nitride film 118 on the polysilicon 116; and (In the forty-eighth step): processing for shaping the storage node bases 120 into a desired shape by means of etching.

After the formation of the storage node base 120, there is performed a storage node forming process.

Figure 27:
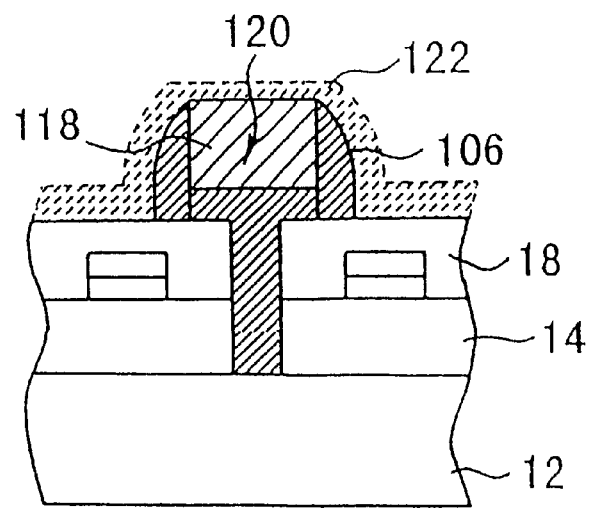
FIG. 27 is a fragmentary cross-sectional view for explaining the forty-ninth and fiftieth steps of the method of manufacturing the DRAM shown in FIG. 25.

FIG. 27 is a cross-sectional view for explaining the storage node forming process. During the storage node forming process, there are performed the following processing operations.

(In the forty-ninth step): processing for depositing doped polysilicon 122 (indicated by a broken line provided in FIG. 27) so as to cover the storage node bases 120; and (In the fiftieth step): processing for forming the vertical surface 110 of each of the storage nodes 106 (indicated by a solid line provided in FIG. 27) by means of etching back the doped polysilicon 122 until the nitride film 118 becomes exposed.

After completion of the foregoing processing, an oxide film forming process is performed.

Figure 28:
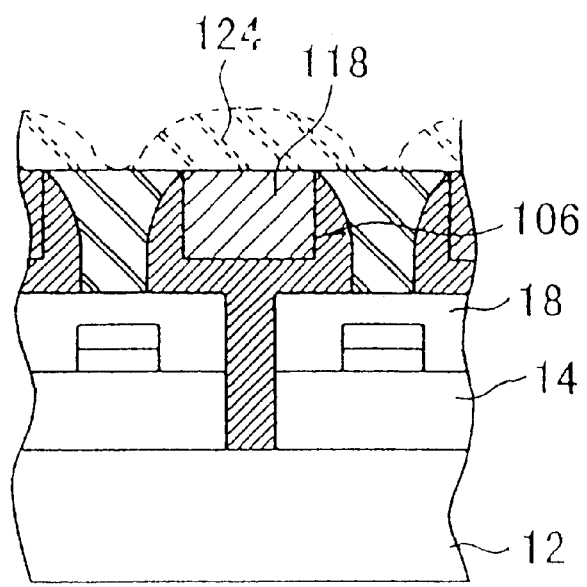
FIG. 28 is a fragmentary cross-sectional view for explaining the fifty-first and fifty-second steps of the method of manufacturing the DRAM shown in FIG. 25.

FIG. 28 is a cross-sectional view for explaining the oxide film forming process. During the oxide film forming process, there are performed the following processing operations.

(In the fifty-first step): processing for depositing an oxide film 124 (indicated by solid and broken lines provided in FIG. 28) on the storage nodes 106 and the second TEOS layer 18; and (In the fifty-second step): processing for polishing the oxide film 124 by means of CMP until the nitride film 106 becomes exposed.

By means of the foregoing processing, the space among the adjacent storage nodes 106 can be filled with the oxide film 124. After completion of the foregoing processing, there is performed a process for eliminating undesired areas.

Figure 29:
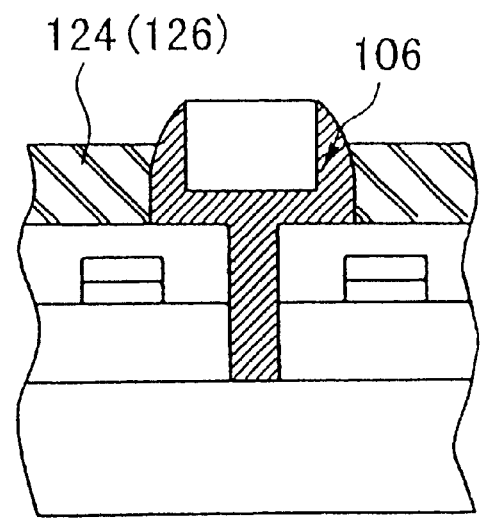
FIG. 29 is a fragmentary cross-sectional view for explaining the fifty-third and fifty-fourth steps of the method of manufacturing the DRAM shown in FIG. 25.

FIG. 29 is a cross-sectional view for explaining the process for eliminating undesired areas. During the process, there are performed the following processing operations.

(In the fifty-third step): processing for eliminating the nitride film 118 remaining in the storage nodes 106 by etching; and (In the fifty-fourth step): processing for forming a dielectric film 126 for tilt prevention purpose by etching the oxide film 124 to a given thickness. In this embodiment, the thickness of the dielectric film 126 is determined such that the storage node 106 assumes a desired capacity. The oxide-film etching for reducing the thickness of the oxide film 124 may be a dry process or a wet process.

After the formation of the dielectric film 128, the following processing is performed as in the case of the first embodiment. Namely, a nitride film 34 is formed on the storage nodes 106 and the dielectric film 126 (the fifty-fifth step); a cell plate 112 is formed on the nitride film 34 (the fifty-sixth step); and an interconnection layer 94 is provided on the cell plate 112 (the fifty-seventh step). The DRAM 104 according to the fourth embodiment is manufactured through the forgoing process.

As mentioned previously, the dielectric film which prevents the storage node 106 from tilting is appropriately provided by the manufacturing method according to the fourth embodiment as well as by the method using the cylindrical spaces. Accordingly, even in the case of the storage node capacitor structure according to the fourth embodiment, the elongated storage nodes 106 can be manufactured at high yield.

Since a semiconductor device according to the present invention has the structure as mentioned previously, the device yields the following advantageous results:

According to a first aspect of the present invention, since the dielectric film for tilt prevention purposes is formed so as to be in close contact with the side surface of the storage node, the storage node can be effectively prevented from tilting.

According to a second aspect of the present invention, since the dielectric film for tilt prevention purposes is interposed among the plurality of storage nodes, there can be achieved a function of effectively preventing a plurality of storage nodes from tilting.

According to a third aspect of the present invention, the end face of the dielectric film is positioned closer to the tip end of the storage node than to the horizontal surface of the same. With a view to preventing the storage nodes from tilting, it is more advantageous to position the end face of the dielectric film closer to the tip end of the vertical surface. For this reason, according to the structure of the present invention, the vertical surface can be effectively prevented from tilting by presence of the dielectric film for tilt prevention purposes.

According to a fourth aspect of the present invention, since the dielectric film for tilt prevention purposes is formed so as to surround the cylindrically-formed vertical surface, large capacitance can be imparted to the storage node capacitor, and the storage node capacitors can be effectively prevented from tilting.

According to a fifth aspect of the present invention, since the dielectric film is formed from an oxide film which is generally used as an interlayer film of a semiconductor device, there can be prevented inconvenience, which would otherwise be caused by the formation of the dielectric film.

According to a sixth aspect of the present invention, since the dielectric film is formed from a nitride film harder than the oxide film, there can be achieved a function of preventing a storage node capacitor from tilting by virtue of presence of the dielectric film.

According to a seventh aspect of the present invention, since the dielectric film is formed from a mixed film comprising an oxide film and a nitride film, there can be achieved a tilt prevention function while inconvenience associated with formation of the dielectric film is avoided.

According to an eighth aspect of the present invention, after a vertical surface for the storage node has been formed in a cylindrical space, the dielectric film for tilt prevention purposes is formed by etching the dielectric film constituting the cylindrical space. The foregoing method enables formation, through simple steps, of a storage node having a wide surface area and a dielectric film for preventing the storage node from tilting.

According to a ninth aspect of the present invention, a dielectric film for tilt prevention purposes can be formed through simple steps so as to have an end face positioned closer to the tip end of the storage node than to the surface of the same. Therefore, the present invention enables implementation, through simple steps, of a storage node capacity structure having a superior tilt prevention function.

According to a tenth aspect of the present invention, since the dielectric film is formed from an oxide film, there can be achieved a storage node capacitor structure which exhibits a tilt prevention function without involving inconvenience.

According to an eleventh aspect of the present invention, since the dielectric film is formed from a nitride film, there can be achieved a storage node capacitor structure having a particularly superior tilt prevention function.

According to a twelfth aspect of the present invention, in addition to realization, through simple steps, of a storage node capacitor structure having a dielectric film for tilt prevention purposes, there is enabled formation of a cylindrical space for a storage node by means of a self-alignment method. According to the present invention, even if a position of a mask used in a photolithography shifts from the right position, storage nodes can be appropriately formed.

According to a thirteenth aspect of the present invention, a dielectric film for tilt prevention purposes can be formed by elimination of a third dielectric layer formed on a second dielectric layer. According to the method mentioned previously, a dielectric film for tilt prevention purposes can be stably formed without regard to variations in etching conditions during the step of forming the dielectric film.

According to a fourteenth aspect of the present invention, cylindrical spaces can be appropriately formed by means of a self-alignment contact method by execution of etching suitable for eliminating an oxide film and etching suitable for eliminating a nitride film. Further, according to the present invention, since the dielectric film for tilt prevention purposes can be formed from a mixed film—comprising a nitride film and an oxide film—from a film formed solely from a nitride film, there can be obtained a superior tilt prevention function.

According to a fifteenth aspect of the present invention, a storage node having a horizontal surface and a vertical surface is formed without forming a cylindrical space on a semiconductor substrate, and a dielectric film for tilt prevention purposes is formed so as to surround the storage node. Subsequently, a fourth dielectric layer provided in the vertical surface is eliminated, thus rendering the vertical surface cylindrical. The foregoing technique enables stable formation, through simple operations, of a cylindrical vertical surface surrounded by the dielectric film for tilt prevention purposes.

According to a sixteenth aspect of the present invention, as a result of etching the dielectric film—which surrounds the cylindrical vertical surface—to a given length, a large surface area can be imparted to the storage node. Consequently, according to the present invention, compact storage capacitors having large capacitance can be manufactured at high yield.

According to a seventeenth aspect of the present invention, since the dielectric film can be formed from an oxide film, compact storage node capacitors having large capacitance can be manufactured without involving inconvenience during formation of the dielectric film.

Further, the present invention is not limited to these embodiments, but variations and modifications may be made without departing from the scope of the present invention.

What is claimed is:

1. A method of manufacturing a semiconductor device having a storage node and a dielectric film for tilt prevention purposes, wherein the storage node has a vertical surface which extends in the direction perpendicular to the surface of a semiconductor substrate, and wherein the dielectric film is brought into close contact with the side surface of the vertical surface and prevents the vertical surface from tilting, the method comprising the sequential steps of:

forming a first dielectric layer over the substrate;

forming a storage node contact extending through the first dielectric layer to the substrate;

forming a second dielectric layer over the first dielectric layer;

forming a cylindrical space in the second dielectric layer;

forming in the cylindrical space the storage node having the vertical surface; and forming a dielectric film for tilt preventing purpose which prevents the vertical surface from tilting by etching the second dielectric layer to a film thickness after formation of the vertical surface, said film thickness being determined such that the storage node assumes a desired capacity, wherein the step for forming the cylindrical space comprises the steps of:

forming signal lines on the surface of the first dielectric layer;

forming a third dielectric layer from a third dielectric material so as to cover the surface of the signal lines;

forming a fourth dielectric layer from a fourth dielectric material, which differs from the third dielectric material, so as to cover the third dielectric layer;

forming the second dielectric layer from a second dielectric material, which differs from the fourth dielectric material, so as to cover the fourth dielectric layer;

etching an area where the cylindrical space is to be formed, by means of a measure suitable for removing the second dielectric material and for conserving the fourth dielectric material; and etching an area where the cylindrical space is to be formed, by means of a measure suitable for removing the fourth dielectric material and for conserving the third and second dielectric materials.

2. The method of manufacturing a semiconductor device as defined in claim 1, wherein the fourth dielectric layer has a thickness required by the dielectric film for tilt prevention purposes; and wherein the dielectric film for tilt prevention purposes is formed by removal of the second dielectric layer remaining on the fourth dielectric layer after formation of the vertical surface.

3. The method of manufacturing a semiconductor device as defined in claim 1, wherein the third and second dielectric films are oxide films, and the fourth dielectric film is a nitride film.

* * * * *